US009252674B2

(12) United States Patent
Yang et al.

(10) Patent No.: US 9,252,674 B2
(45) Date of Patent: Feb. 2, 2016

(54) TRANSISTOR GATE DRIVER WITH CHARGE PUMP CIRCUIT FOR OFFLINE POWER CONVERTERS

(71) Applicant: SYSTEM GENERAL CORP., Taipei Hsien (TW)

(72) Inventors: Ta-Yung Yang, Milpitas, CA (US);
Chin-Yen Lin, Hsinchu County (TW);
Jung-Sheng Chen, Kaohsiung (TW); Li Lin, Taipei (TW)

(73) Assignee: System General Corp., Taipei Hsien (TW)

( * ) Notice: Subject to any disclaimer, the term of this patent is extended or adjusted under 35 U.S.C. 154(b) by 211 days.

(21) Appl. No.: 14/088,628

(22) Filed: Nov. 25, 2013

(65) Prior Publication Data

US 2014/0146579 A1    May 29, 2014

Related U.S. Application Data

(60) Provisional application No. 61/729,657, filed on Nov. 26, 2012.

(51) Int. Cl.
*H02M 3/335* (2006.01)
*H03K 17/06* (2006.01)

(52) U.S. Cl.
CPC ......... *H02M 3/33523* (2013.01); *H03K 17/063* (2013.01)

(58) Field of Classification Search
CPC .................................................. H02M 3/33507

USPC ......... 363/21.01, 21.04, 21.08, 21.12, 21.16, 363/97
See application file for complete search history.

(56) References Cited

U.S. PATENT DOCUMENTS

| 6,721,192 | B1 | 4/2004 | Yang et al. | |
|---|---|---|---|---|
| 6,853,563 | B1 | 2/2005 | Yang et al. | |
| 6,977,824 | B1 | 12/2005 | Yang et al. | |
| 7,016,204 | B2 | 3/2006 | Yang et al. | |
| 7,471,121 | B2 | 12/2008 | Yang et al. | |
| 8,488,342 | B2 * | 7/2013 | Zhang | H02M 3/33523 323/242 |
| 2010/0128501 | A1 * | 5/2010 | Huang | H02M 3/33523 363/21.16 |
| 2014/0146579 | A1 * | 5/2014 | Yang | H03K 17/063 363/21.16 |

* cited by examiner

*Primary Examiner* — Jeffrey Sterrett
(74) *Attorney, Agent, or Firm* — Rosenberg, Klein & Lee

(57) ABSTRACT

A controller of the power converter according to the present invention comprises a gate driver. The gate driver generates a gate-drive signal. The gate-drive signal is coupled to drive a power transistor to switch a transformer of the power converter for regulating an output of the power converter. The gate driver has a charge-pump circuit for charging pump a voltage level of the gate-drive signal. Therefore, the gate-drive signal can fully turn on the power transistor.

11 Claims, 6 Drawing Sheets

TRANSISTOR GATE DRIVER WITH CHARGE PUMP CIRCUIT FOR OFFLINE POWER CONVERTERS

BACKGROUND OF THE INVENTION

1. Field of Invention

The present invention relates to a power converter, and more particularly, the present invention relates to a transistor gate driver with a charge-pump circuit of a controller for the power converter.

2. Description of Related Art

FIG. 1 shows a circuit diagram of a primary side regulated power converter with the constant current output. The power converter (such as a power adaptor) is required to charge a battery with a constant current. The power converter includes a transformer 110 for generating an output (an output voltage $V_O$ and an output current $I_O$). The transformer 110 has a primary winding $N_P$, a secondary winding $N_S$, and an auxiliary winding $N_A$. The secondary winding $N_S$ generates the output voltage $V_O$ and the output current $I_O$ through a diode 140 and a capacitor 145. The output voltage $V_O$ and the output current $I_O$ are generated at an output terminal of the power converter. A first terminal of the primary winding $N_P$ is coupled to an input voltage $V_{IN}$. A second terminal of the primary winding $N_P$ is coupled to a drain of a power transistor 120.

A controller 50 generates a gate-drive signal $S_G$. The gate-drive signal $S_G$ is coupled to a gate of the power transistor 120 to drive the power transistor 120 for switching the transformer 110 and regulating the output voltage $V_O$ and the output current $I_O$ of the power converter. In other words, the transformer 110 is magnetized when the power transistor 120 is turned on.

A current-sense device, such as a resistor 125, is coupled between a source of the power transistor 120 and a ground. The resistor 125 detects a switching current $I_T$ of the transformer 110 to generate a current-sense signal $V_{CS}$ coupled to the controller 50. The current-sense signal $V_{CS}$ is correlated to the switching current $I_T$.

An anode of the diode 140 is coupled to a first terminal of the secondary winding $N_S$. The capacitor 145 is coupled between a cathode of the diode 140 and a second terminal of the secondary winding $N_S$. The capacitor 145 is further coupled to the output terminal of the power converter.

An anode of a diode 130 is coupled to a first terminal of the auxiliary winding $N_A$ of the transformer 110. A second terminal of the auxiliary winding $N_A$ is coupled to the ground. A capacitor 135 is coupled between a cathode of the diode 130 and the ground. Once the power transistor 120 is turned off, the secondary winding $N_S$ of the transformer 110 will generate the output voltage $V_O$ and the output current $I_O$ via the diode 140 and the capacitor 145. Meanwhile, through the diode 130 and the capacitor 135, the auxiliary winding $N_A$ of the transformer 110 will generate a source voltage $V_{DD}$ coupled to supply the power for the controller 50. The diodes 130 and 140 are used as the rectifier.

Because of the secondary winding $N_S$ and the auxiliary winding $N_A$ are proportional to the primary winding $N_P$, the current-sense signal $V_{CS}$ and the source voltage $V_{DD}$ are correlated to the output current $I_O$ and the output voltage $V_O$ respectively. The source voltage $V_{DD}$ is correlated to the output voltage $V_O$ according to the following equation (1).

$$V_{DD} = \frac{T_{NA}}{T_{NS}} \times V_O \quad (1)$$

where "$T_{NA}/T_{NS}$" is the turn ratio of the auxiliary winding $N_A$ and the secondary winding $N_S$ of the transformer 110.

A voltage divider including resistors 131 and 133 is coupled between the auxiliary winding $N_A$ of the transformer 110 and the ground. Through the auxiliary winding $N_A$ of the transformer 110, a reflected signal $V_S$ coupled to the controller 50 is generated at the join of the resistors 131 and 133. Because of the auxiliary winding $N_A$ is related to the secondary winding $N_S$, the reflected signal $V_S$ is related to the output voltage $V_O$ and the output current $I_O$. The gate-drive signal $S_G$ is thus generated in accordance with the reflected signal $V_S$ for regulating the output voltage $V_O$ and the output current $I_O$ of the power converter.

The primary side regulation technologies had been disclosed in many prior arts such as, "PWM controller regulating output voltage and output current in primary side", U.S. Pat. No. 6,721,192; "Primary-side controlled flyback power converter", U.S. Pat. No. 6,853,563; "Control circuit for controlling output current at the primary side of a power converter", U.S. Pat. No. 6,977,824.

FIG. 2 shows the characteristic curve for the output voltage $V_O$ versus the output current $I_O$ of the power converter shown in FIG. 1. When the output current $I_O$ of the power converter reaches the constant current level, the output voltage $V_O$ will be decreased for regulating its output current $I_O$ as a constant. Once the output voltage $V_O$ decreases to a low voltage as shown in a curve 150, the source voltage $V_{DD}$ of the controller 50 will be decreased accordingly (as shown in equation 1). The low source voltage $V_{DD}$ would generate a low voltage gate-drive signal $S_G$ that cannot turn on the power transistor 120.

The object of the present invention is to solve this problem. A transistor gate driver is developed to fully turn on the power transistor 120 even when the source voltage $V_{DD}$ is low. A prior art "Transistor drive circuit of power converter operating in a wide voltage range", U.S. Pat. No. 7,471,121 was designed to solve this problem, but its drawbacks are bigger die size and the higher cost of the circuit of the controller.

BRIEF SUMMARY OF THE INVENTION

The objective of the present invention is to provide a gate driver with a charge-pump circuit of a controller for power converters, that can reduces the cost and size of the circuit of the controller.

A controller of a primary side regulated power converter according to the present invention comprises a switching circuit, a gate driver, and a voltage regulator. The switching circuit generates a switching signal in response to a feedback signal for regulating an output of the power converter. The gate driver is coupled to receive the switching signal for generating a gate-drive signal. The gate-drive signal is coupled to drive a power transistor for switching a primary winding of a transformer of the power converter. The transformer has an auxiliary winding to provide a source voltage for powering the controller. The voltage regulator receives a power source for generating a regulated voltage coupled to supply the power for the switching circuit and the gate driver. The gate driver has a charge-pump circuit coupled to the source voltage and the regulated voltage for charging pump the voltage level of the gate-drive signal.

A controller of a power converter according to the present invention comprises a gate driver. The gate driver generates a gate-drive signal coupled to drive a power transistor to switch a transformer of the power converter for regulating an output of the power converter. The gate driver has a charge-pump circuit for charging pump a voltage level of the gate-drive signal.

BRIEF DESCRIPTION OF ACCOMPANIED DRAWINGS

The accompanying drawings are included to provide further understanding of the invention, and are incorporated into and constitute a part of this specification. The drawings illustrate embodiments of the invention and, together with the description, serve to explain the principles of the invention.

DETAILED DESCRIPTION OF EMBODIMENTS

Figure 3:
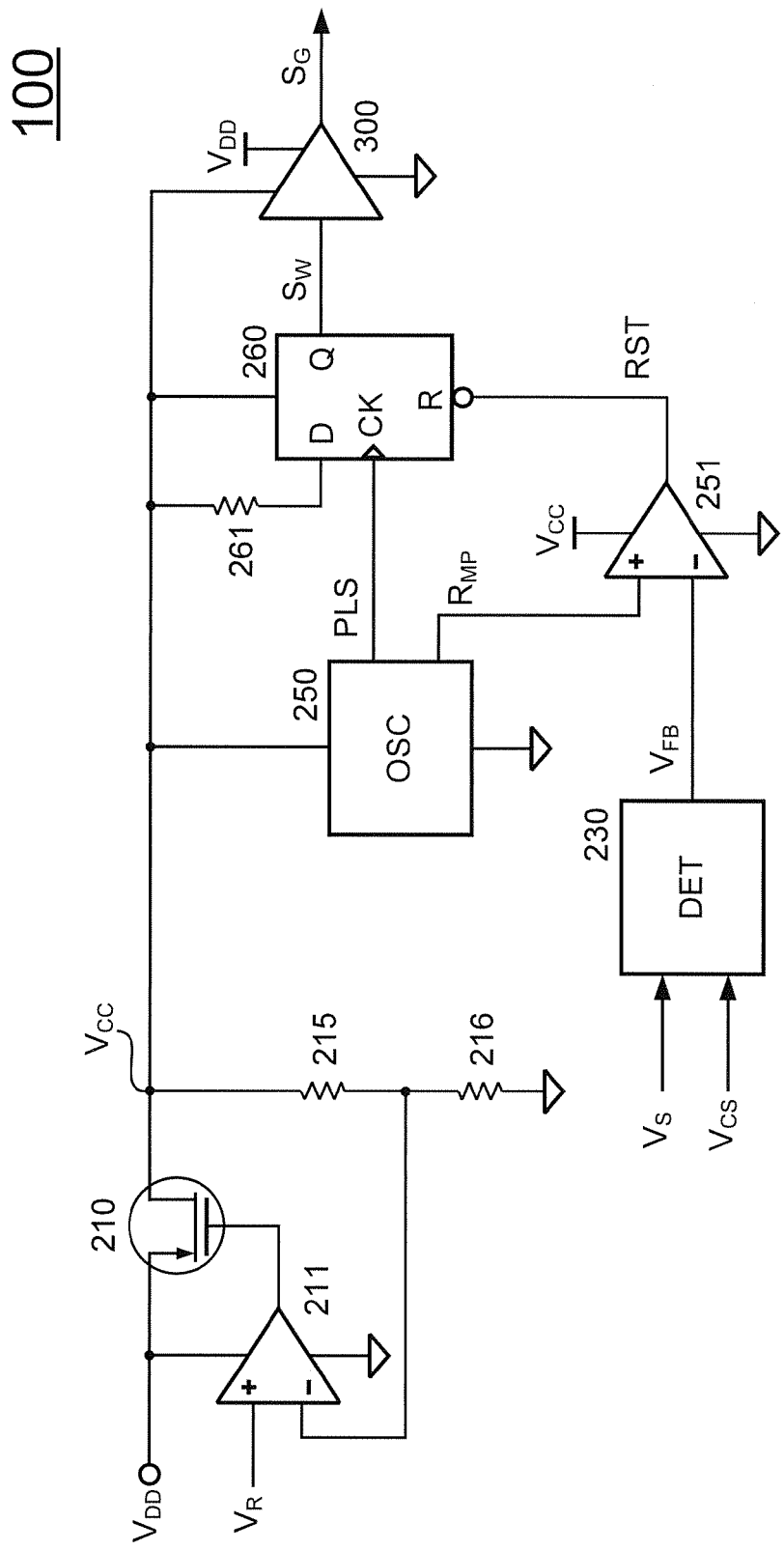
FIG. 3 is a circuit schematic of an embodiment of the controller according to the present invention.

FIG. 3 is a circuit schematic of an embodiment of a controller according to the present invention. The controller 100 replaces the controller 50 shown in FIG. 1. The source voltage $V_{DD}$ is coupled to a source of a transistor 210 and an error amplifier 211. A drain of the transistor 210 is coupled to a voltage divider. In this embodiment, the transistor 210 is the PMOS type. The voltage divider includes resistors 215 and 216. A first terminal of the resistor 215 is coupled to the drain of the transistor 210. The resistor 216 is coupled between a second terminal of the resistor 215 and the ground. A positive input terminal of the error amplifier 211 is coupled to receive a reference signal $V_R$. A negative input terminal of the error amplifier 211 is coupled to a join of the resistors 215 and 216. An output terminal of the error amplifier 211 is coupled to a gate of the transistor 210.

The source voltage $V_{DD}$ could be a various voltage, such as 5V to 25V. Thus, the transistor 210 associated with the error amplifier 211 develop a LDO (low dropout) regulator coupled to receive the source voltage $V_{DD}$ to generate a regulated voltage $V_{CC}$. That is, the LDO regulator is operated as a voltage regulator. The regulated voltage $V_{CC}$ is used to supply the power to the circuits of the controller 100. The source voltage $V_{DD}$ serves as a power source for the LDO regulator to generate the regulated voltage $V_{CC}$.

Figure 1:
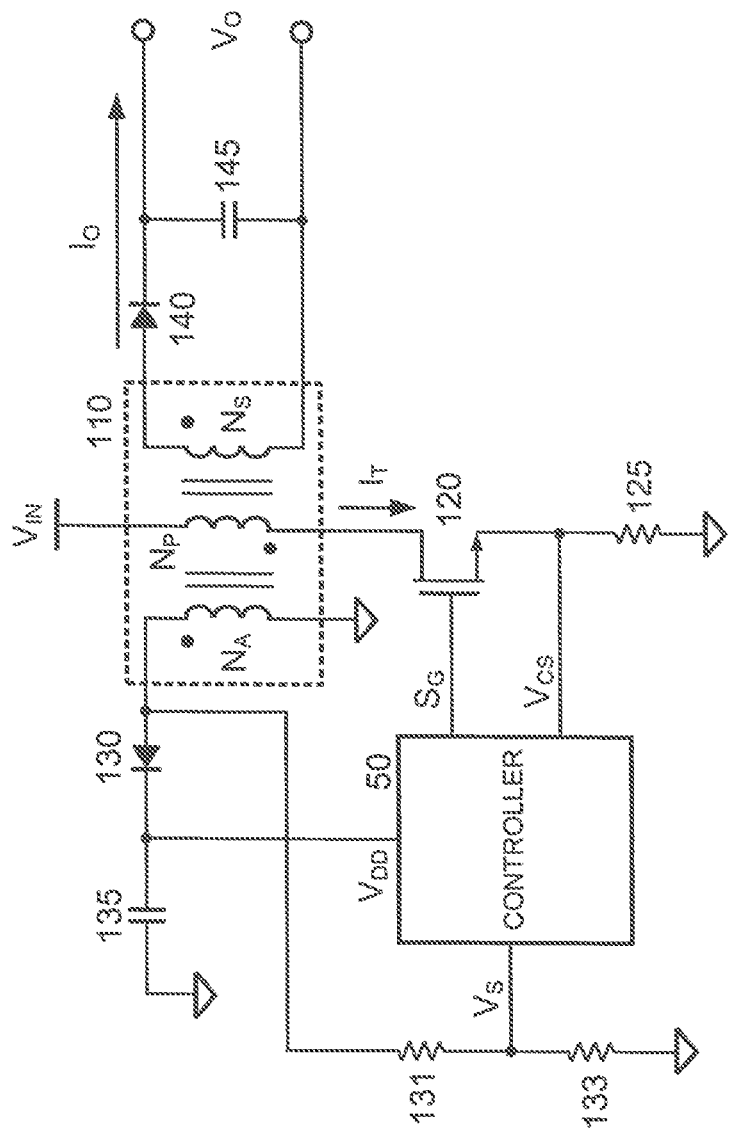
FIG. 1 shows a circuit diagram of a primary side regulated power converter with the constant current output.
Figure 2:
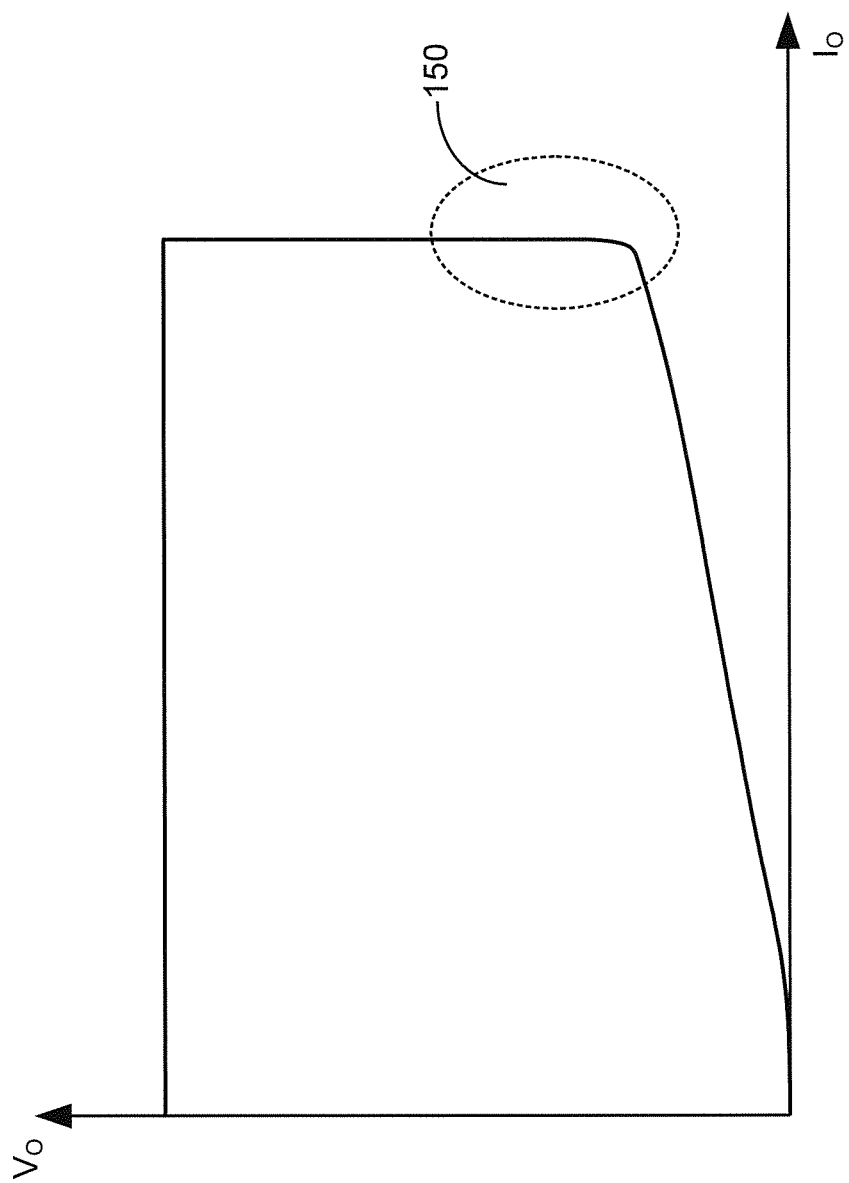
FIG. 2 shows the characteristic curve for the output voltage $V_O$ versus the output current $I_O$ of the power converter shown in FIG. 1.

A detection circuit (DET) 230 generates a feedback signal $V_{FB}$ in accordance with the reflected signal $V_S$ and the current-sense signal $V_{CS}$ for regulating the output voltage $V_O$ and the output current $I_O$ (as shown in FIG. 1) of the power converter. The detail operation of the detection circuit 230 can be found in a prior art of "Close-loop PWM controller for primary-side controlled power converters", U.S. Pat. No. 7,016,204.

A switching circuit comprises the detection circuit (DET) 230, an oscillator (OSC) 250, a flip-flop 260, and a comparator 251 to generate a switching signal $S_W$ for regulating the output of the power converter in response to the reflected signal $V_S$ and the current-sense signal $V_{CS}$. Because the reflected signal $V_S$ and the current-sense signal $V_{CS}$ are correlated to the output voltage $V_O$ and the output current $I_O$ respectively, the switching circuit generates the switching signal $S_W$ in response to the output voltage $V_O$ and the output current $I_O$.

The oscillator 250 is coupled to receive the regulated voltage $V_{CC}$. The oscillator 250 generates an oscillation signal PLS and a ramp signal $R_{MP}$. An input terminal D of the flip-flop 260 is coupled to receive the regulated voltage $V_{CC}$ through a resistor 261. The oscillation signal PLS is coupled to a clock input terminal CK of the flip-flop 260 to enable the switching signal $S_W$ output in an output terminal Q of the flip-flop 260.

The regulated voltage $V_{CC}$ is supplied to the comparator 251. A positive input terminal of the comparator 251 is coupled to receive the ramp signal $R_{MP}$, and a negative input terminal of the comparator 251 is coupled to receive the feedback signal $V_{FB}$. Through the comparator 251, the feedback signal $V_{FB}$ compares with the ramp signal $R_{MP}$ to generate a reset signal RST when the feedback signal $V_{FB}$ is higher than the ramp signal $R_{MP}$. The reset signal RST is coupled to a reset input terminal R of the flip-flop 260 to reset the flip-flop 260 and disable the switching signal $S_W$. The switching signal $S_W$ is utilized to generate the gate-drive signal $S_G$ through a transistor gate driver 300. The gate-drive signal $S_G$ is coupled to drive the power transistor 120 for switching the primary winding $N_P$ of the transformer 110 (as shown in FIG. 1). The regulated voltage $V_{CC}$ and the source voltage $V_{DD}$ are supplied to the transistor gate driver 300 to generate the gate-drive signal $S_G$. In other words, the switching circuit generates the switching signal $S_W$ for regulating the output of the power converter in response to the feedback signal $V_{FB}$.

Figure 4:
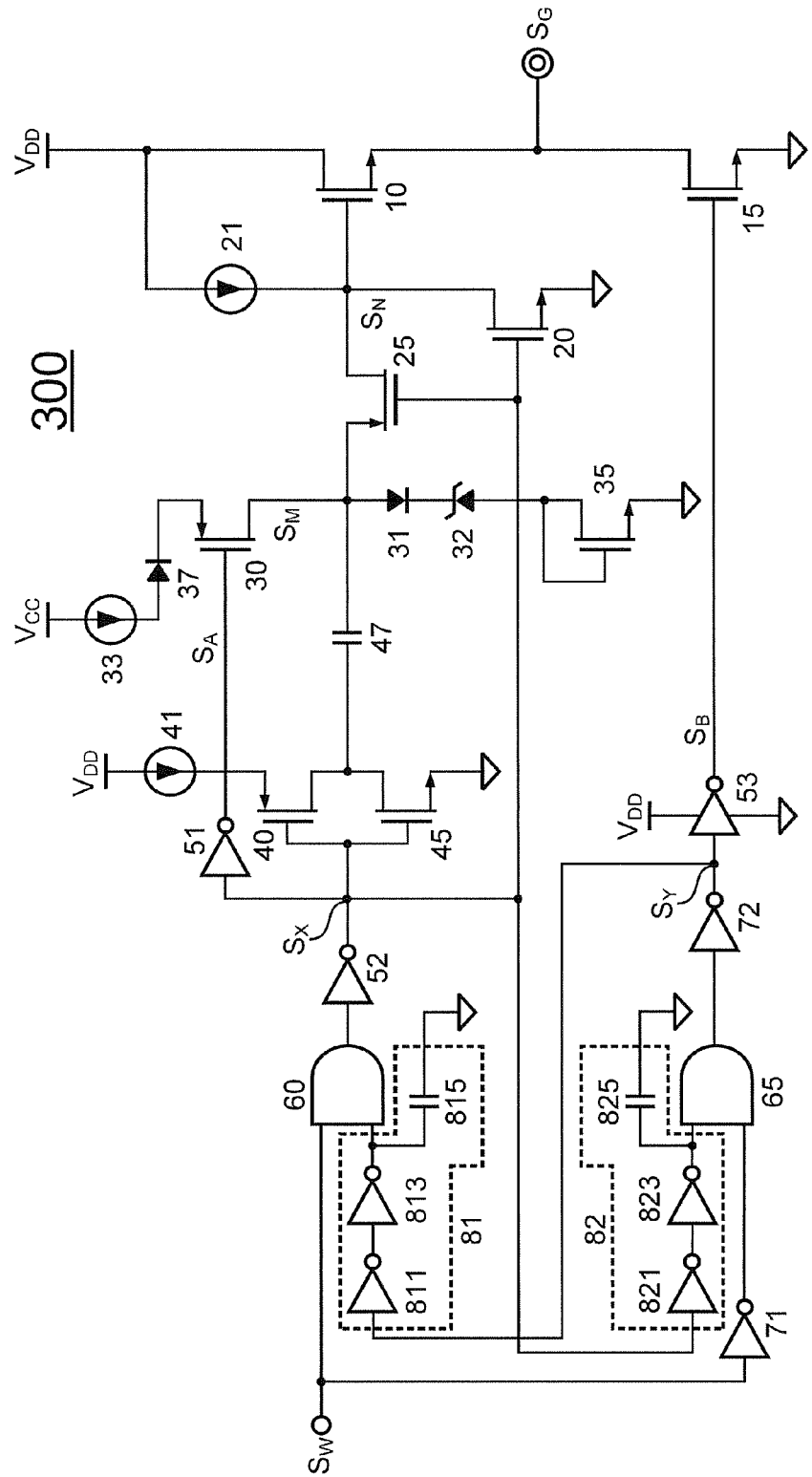
FIG. 4 is a circuit schematic of an embodiment of the transistor gate driver in accordance with the present invention.

FIG. 4 is a circuit schematic of an embodiment of the transistor gate driver 300 in accordance with the present invention. The transistor gate driver 300 includes a high-side transistor 10, a low-side transistor 15, and a charge-pump circuit. A drain of the high-side transistor 10 is coupled to the source voltage $V_{DD}$. A source of the high-side transistor 10 is coupled to an output terminal. The output terminal outputs the gate-drive signal $S_G$. A drain of the low-side transistor 15 is coupled to the output terminal. A source of the low-side transistor 15 is coupled to the ground. The high-side transistor 10 is utilized to pull high the gate-drive signal $S_G$ for switching on the power transistor 120 shown in FIG. 1. That is, the high-side transistor 10 is utilized to generate the high state of the gate-drive signal $S_G$. The low-side transistor 15 is utilized to pull low the gate-drive signal $S_G$ for switching off the power transistor 120. In other words, the low-side transistor 15 is utilized to generate the low state of the gate-drive signal $S_G$.

The switching signal $S_W$ is coupled to a first input terminal of an AND gate 60. An output terminal of the AND gate 60 is coupled to an inverter 52 to generate a turn-on signal $S_X$ (low-true signal). The switching signal $S_W$ is further coupled to a first input terminal of an AND gate 65 through an inverter 71. An output terminal of the AND gate 65 is coupled to an inverter 72 to generate a turn-off signal $S_Y$ (low-true signal). The turn-off signal $S_Y$ is coupled to a second input terminal of the AND gate 60 through an anti-cross-conduction delay-circuit 81. The turn-on signal $S_X$ is coupled to a second input terminal of the AND gate 65 through other anti-cross-conduction delay-circuit 82.

The turn-on signal $S_X$ is further coupled to a gate of a transistor 20 to control the transistor 20 for controlling the high-side transistor 10. A drain of the transistor 20 is coupled to a gate of the high-side transistor 10. A source of the transistor 20 is coupled to the ground. A third current source 21 is coupled between the drain and the gate of the high-side transistor 10. The third current source 21 is supplied by the source voltage $V_{DD}$. Once the transistor 20 is turned on by the turn-on signal $S_X$, the gate of the high-side transistor 10 is coupled to the ground and thus the high-side transistor 10 is turned off. Conversely, the high-side transistor 10 can be turned on for pulling high the gate-drive signal $S_G$ when the transistor 20 is turned off by the turn-on signal $S_X$.

The turn-off signal $S_Y$ is coupled to an inverter 53 to generate a signal $S_B$. The source voltage $V_{DD}$ is further supplied to the inverter 53. The inverter 53 is further coupled to the ground. The signal $S_B$ is coupled to a gate of the low-side transistor 15 to control the low-side transistor 15. Once the low-side transistor 15 is turned on, the gate-drive signal $S_G$ will be pulled low.

The anti-cross-conduction delay-circuit 81 comprises inverters 811, 813, and a capacitor 815. An input terminal of the inverter 811 is coupled to receive the turn-off signal $S_Y$. The inverter 813 is connected to the inverter 811 in series. The capacitor 815 is coupled between an output terminal of the inverter 813 and the ground. A join of the inverter 813 and the capacitor 815 is coupled to the second input terminal of the AND gate 60.

The anti-cross-conduction delay-circuit 82 comprises inverters 821, 823, and a capacitor 825. An input terminal of the inverter 821 is coupled to receive the turn-on signal $S_X$. The inverter 823 is connected to the inverter 821 in series. The capacitor 825 is coupled between an output terminal of the inverter 823 and the ground. A join of the inverter 823 and the capacitor 825 is coupled to the second input terminal of the AND gate 65.

In accordance with the above mention, the switching signal $S_W$ is coupled to generate the turn-on signal $S_X$ and the turn-off signal $S_Y$ via the inverters 52, 71, 72, the AND gates 60, 65, and the anti-cross-conduction delay-circuits 81, 82 respectively. The turn-on signal $S_X$ (low-true signal) is utilized to turn on the high-side transistor 10 and pull high the gate-drive signal $S_G$ for switching on the power transistor 120 shown in FIG. 1. The turn-off signal $S_Y$ (low-true signal) is applied to turn on the low-side transistor 15 and pull low the gate-drive signal $S_G$ for switching off the power transistor 120. The AND gates 60 and 65 associated with the anti-cross-conduction delay-circuits 81 and 82 prevent the cross conduction of the high-side transistor 10 and the low-side transistor 15.

The charge-pump circuit includes transistors 30, 40, 45, current sources 33, 41, a diode 37, and a charge-pump capacitor 47. The first current source 33 is supplied by the regulated voltage $V_{CC}$. The first current source 33, the diode 37, and the transistor 30 are connected in series. The diode 37 is coupled between the first current source 33 and a source of the transistor 30. A drain of the transistor 30 is coupled to a first terminal of the charge-pump capacitor 47. A signal $S_A$ is coupled to a gate of the transistor 30 to control the transistor 30. The turn-on signal $S_X$ is utilized to generate the signal $S_A$ through an inverter 51. Therefore, the transistor 30 is controlled by the turn-on signal $S_X$.

The second current source 41 is supplied by the source voltage $V_{DD}$. The second current source 41 is coupled to a source of the transistor 40. Drains of the transistors 40 and 45 are coupled to a second terminal of the charge-pump capacitor 47. A source of the transistor 45 is coupled to the ground. The turn-on signal $S_X$ is coupled to gates of the transistors 40 and 45 to control the transistors 40 and 45. The type of the transistors 40 and 45 are different. That is, once the transistor 40 is turned on by the turn-on signal $S_X$, the transistor 45 is turned off by the turn-on signal $S_X$.

A transistor 25 is coupled between the first terminal of the charge-pump capacitor 47 and the gate of the high-side transistor 10. A source of the transistor 25 is coupled to the first terminal of the charge-pump capacitor 47. A signal $S_M$ is generated at a join of the charge-pump capacitor 47 and the source of the transistor 25. A drain of the transistor 25 is coupled to the gate of the high-side transistor 10. A signal $S_N$ is generated at a join of the drain of the transistor 25 and the gate of the high-side transistor 10. The turn-on signal $S_X$ is coupled to a gate of the transistor 25 to control the transistor 25. The transistor gate driver 300 further includes a voltage-damper including a diode 31, a zener diode 32, and a transistor 35. An anode of the diode 31 is coupled to the first terminal of the charge-pump capacitor 47. The zener diode 32 is coupled between a cathode of the diode 31 and a drain of the transistor 35. A source of the transistor 35 is coupled to the ground. A gate of the transistor 35 is coupled to the drain of the transistor 35.

Figure 5:
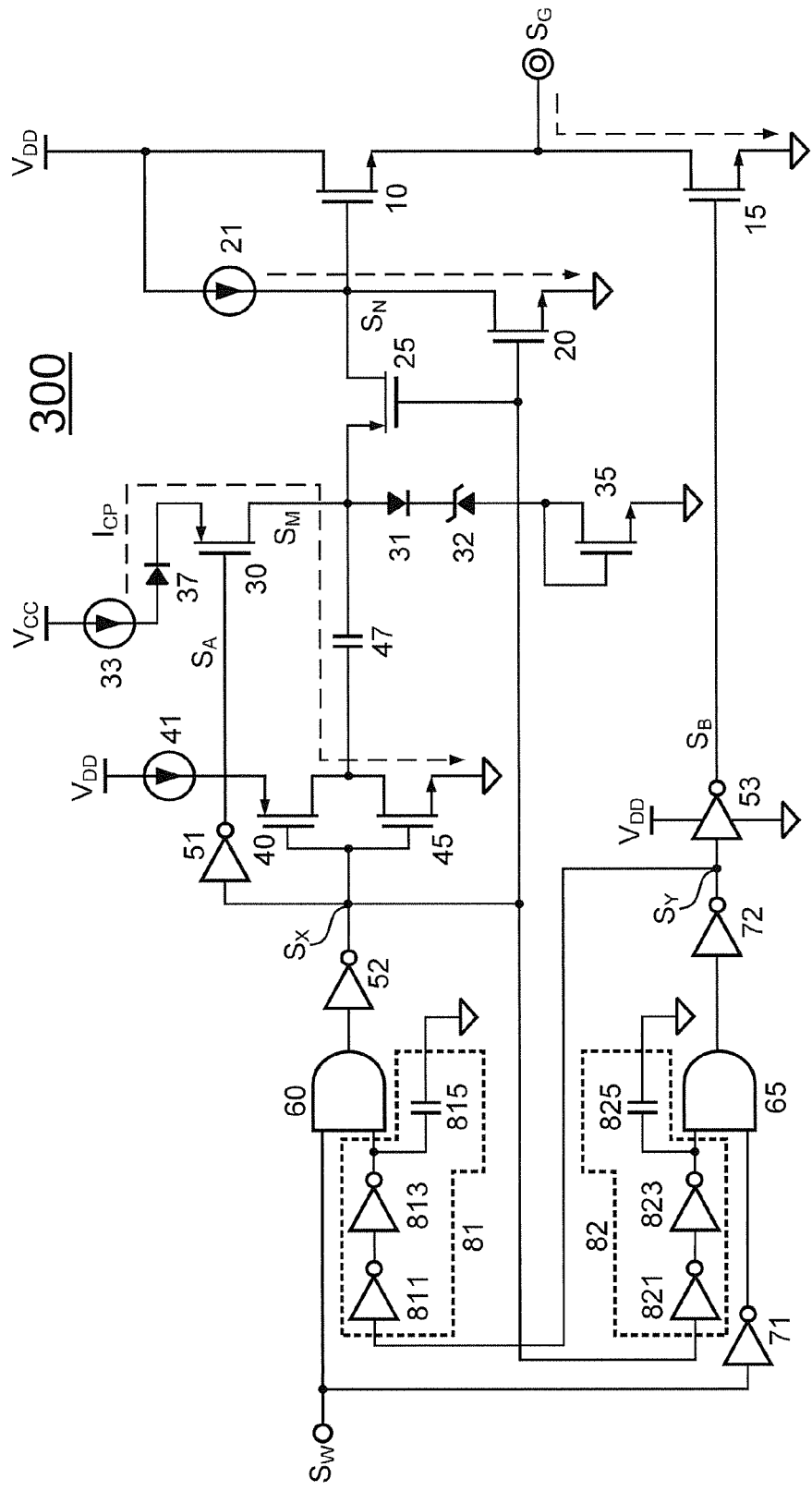
FIG. 5 shows the signal path of the transistor gate driver shown in FIG. 4 when the switching signal is in off state in accordance with the present invention.

FIG. 5 shows the signal path of the transistor gate driver 300 shown in FIG. 4 when the switching signal $S_W$ is in off state in accordance with the present invention. When the switching signal $S_W$ is in off state (logic low-state), the turn-off signal $S_Y$ will be enabled (logic low-state), and therefore the signal $S_B$ will be generated (logic high-state) to turn on the low-side transistor 15 for pulling low the gate-drive signal $S_G$. That is, the gate-drive signal $S_G$ is disabled for switching off the power transistor 120 shown in FIG. 1.

Meanwhile, the turn-on signal $S_X$ will be disabled (logic high-state). This logic high-state of the turn-on signal $S_X$ will cause the transistors 25, 40 to be turned off and the transistors 20, 30, 45 to be turned on. The on state of the transistor 20 will cause the high-side transistor 10 to be turned off. The on state of the transistors 30 and 45 will develop a charge path to the charge-pump capacitor 47 through the first current source 33, the diode 37, the transistors 30, and 45. A charge current $I_{CP}$ is thus generated by the first current source 33 to charge the charge-pump capacitor 47. The first current source 33, the diode 37, and the transistor 30 are connected in series. The first current source 33 limits the charge current $I_{CP}$, which reduces the noise. A voltage approximated to the regulated voltage $V_{CC}$ will be stored in the charge-pump capacitor 47 via the charge current $I_{CP}$ (first current source 33) charging the charge-pump capacitor 47 when the switching signal $S_W$ and the gate-drive signal $S_G$ are disabled.

Figure 6:
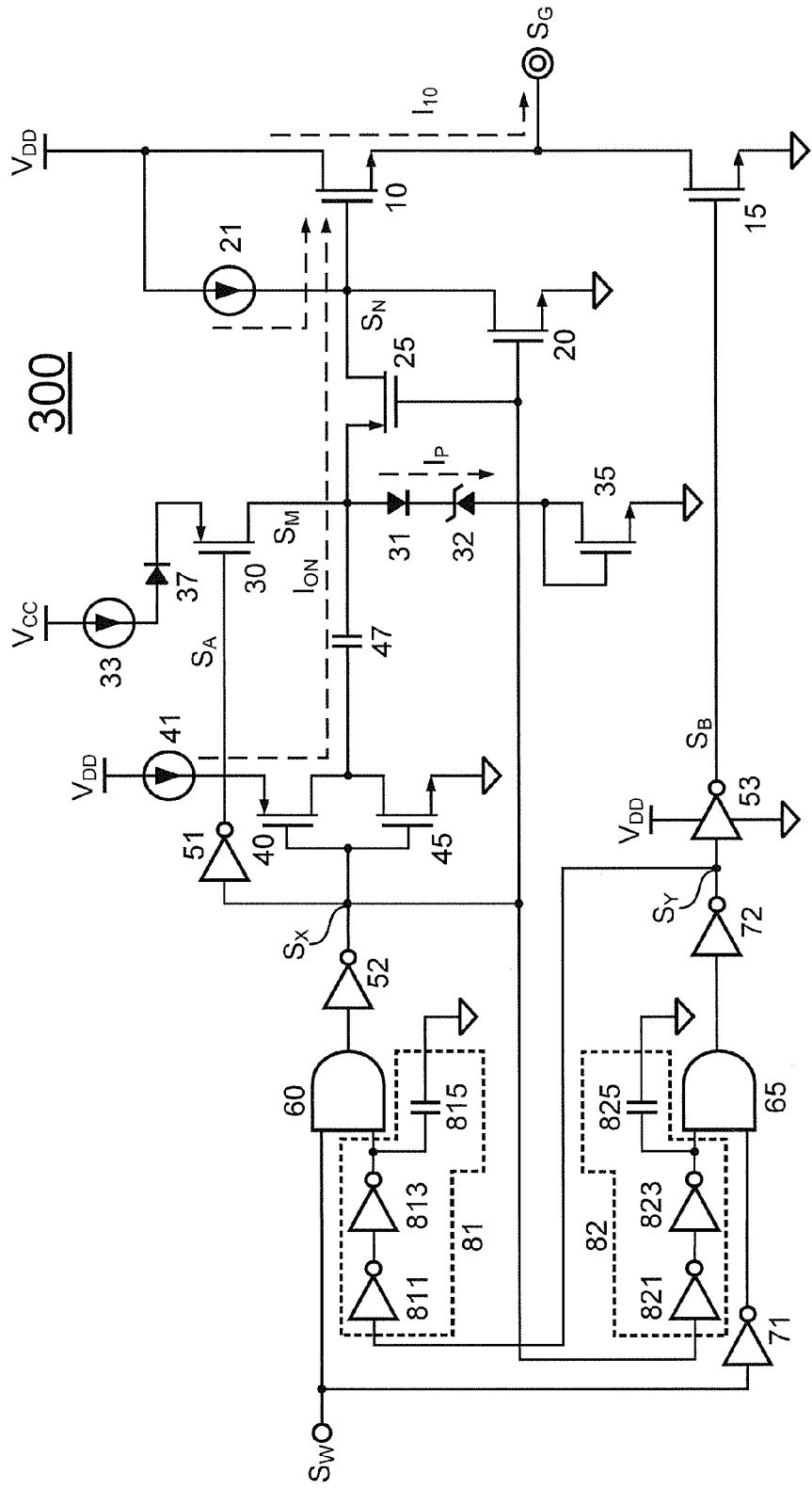
FIG. 6 shows the signal path of the transistor gate driver shown in FIG. 4 when the switching signal is in on state in accordance with the present invention.

FIG. 6 shows the signal path of the transistor gate driver 300 shown in FIG. 4 when the switching signal $S_W$ is in on state in accordance with the present invention. When the switching signal $S_W$ is in on state (logic high-state), the turn-off signal $S_Y$ will be disabled (logic high-state) and the signal $S_B$ will be the logic low-state to turn off the low-side transistor 15. Meanwhile, the turn-on signal $S_X$ will be enabled (logic low-state). This logic low-state of the turn-on signal $S_X$ will cause the transistors 25, 40 to be turned on and the transistors 20, 30, 45 to be turned off. The on state of the transistors 25 and 40 will develop a path to turn on the high-side transistor 10 through the second current source 41, the transistor 40, the charge-pump capacitor 47, and the transistor 25. A turn on current $I_{ON}$ is thus generated by the second current source 41. The second current source 41, the transistor 40, the charge-pump capacitor 47, the transistor 25, and the gate of the high-side transistor 10 are connected in series. The signal $S_M$ is generated at the join of the charge-pump capacitor 47 and the source of the transistor 25. The voltage level ($V_{SM}$) of the signal $S_M$ could be expressed approximately to, $$V_{SM} = V_{DD} + V_{CC} \quad (2)$$

The signal $S_N$ is generated at the join of the drain of the transistor 25 and the gate of the high-side transistor 10 when the transistor 25 is turned on by the turn-on signal $S_X$. The signal $S_N$ is the gate voltage to drive the high-side transistor 10. That is, the gate-drive signal $S_G$ is enabled for switching on the power transistor 120 shown in FIG. 1. The voltage level of the signal $S_N$ is correlated to the voltage level $V_{SM}$ of the signal $S_M$. Therefore, the charge-pump capacitor 47 and the second current source 41 are used to generate the signal $S_M$ for generating the gate voltage of the high-side transistor 10.

A current $I_{10}$ flowing through the high-side transistor 10 is increased in response to the increase of the gate voltage (signal $S_N$) of the high-side transistor 10, and the voltage level of the gate-drive signal $S_G$ is increased in response to the increase of the current $I_{10}$. Therefore, the voltage level of the gate-drive signal $S_G$ is increased in response to the increase of the voltage level of the signal $S_N$. According to equation (2), the charge-pump circuit coupled to the source voltage $V_{DD}$ and the regulated voltage $V_{CC}$ is utilized to charge pump the voltage level $V_{SM}$ of the signal $S_M$. That is, the charge-pump circuit is utilized to charge pump the voltage level of the signal $S_N$ for charging pump the voltage level of the gate-drive signal $S_G$.

The voltage-clamper including the diode 31, the zener diode 32, and the transistor 35 is coupled to the charge-pump capacitor 47 and the gate of the high-side transistor 10 for clamping a maximum voltage of the signal $S_M$, such as 10V. Thus, the maximum voltage of the gate-drive signal $S_G$ is clamped by the voltage-clamper. The second current source 41 limits the turn on current $I_{ON}$ that is coupled to the voltage-clamper and the gate of the high-side transistor 10, which reduces the power loss and the noise. Besides, the second current source 41 and the charge-pump capacitor 47 develop a high-pass filter for rapidly turning on the high-side transistor 10. Once the high-side transistor 10 is turned on, the third current source 21 (such as 10 uA) is applied to pull high the voltage level of the signal $S_N$, that pulls high the voltage level of the gate of the high-side transistor 10.

Although the present invention and the advantages thereof have been described in detail, it should be understood that various changes, substitutions, and alternations can be made therein without departing from the spirit and scope of the invention as defined by the appended claims. That is, the discussion included in this invention is intended to serve as a basic description. It should be understood that the specific discussion may not explicitly describe all embodiments possible; many alternatives are implicit. The generic nature of the invention may not fully explained and may not explicitly show that how each feature or element can actually be representative of a broader function or of a great variety of alternative or equivalent elements. Again, these are implicitly included in this disclosure. Neither the description nor the terminology is intended to limit the scope of the claims.

What is claimed is:

1. A controller of a primary side regulated power converter, comprising:
   a switching circuit generating a switching signal in response to a feedback signal for regulating an output of the power converter;
   a gate driver coupled to receive the switching signal for generating a gate-drive signal, the gate-drive signal coupled to drive a power transistor for switching a primary winding of a transformer of the power converter; in which the transformer has an auxiliary winding to provide a source voltage for powering the controller; and
   a voltage regulator receiving a power source for generating a regulated voltage coupled to supply the power for the switching circuit and the gate driver;
   wherein the gate driver has a charge-pump circuit coupled to the source voltage and the regulated voltage for charging pump the voltage level of the gate-drive signal.

2. The controller as claimed in claim 1, wherein the gate-drive signal is coupled to switch the transformer for regulating an output current of the power converter.

3. The controller as claimed in claim 1, wherein the source voltage is decreased in response to the decrease of an output voltage of the power converter.

4. The controller as claimed in claim 1, wherein the gate driver comprises:
   a charge-pump capacitor; and
   a current source coupled to charge the charge-pump capacitor when the switch signal and the gate-drive signal are disabled;
   in which the current source is supplied by the regulated voltage.

5. The controller as claimed in claim 1, wherein the gate driver comprises:
   a charge-pump capacitor used to generate a gate voltage;
   a high-side transistor for generating a high state of the gate-drive signal; and
   a current source series coupled to the charge-pump capacitor and a gate of the high-side transistor when the switching signal and the gate-drive signal are enabled;
   in which the gate voltage is coupled to the gate of the high-side transistor to drive the high-side transistor, and the current source is supplied by the source voltage.

6. The controller as claimed in claim 1, wherein the gate driver comprises:
   a charge-pump capacitor;
   a high-side transistor for generating a high state of the gate-drive signal; and
   a voltage clamper coupled to the charge-pump capacitor and a gate of the high-side transistor for clamping a maximum voltage of the gate-drive signal.

7. The controller as claimed in claim 1, wherein the gate driver comprises:
   a high-side transistor for generating a high state of the gate-drive signal; and
   a current source coupled to pull high a voltage level of a gate of the high-side transistor.

8. A controller of a power converter, comprising:
   a gate driver generating a gate-drive signal coupled to drive a power transistor to switch a transformer of the power converter for regulating an output of the power converter;
   wherein the gate driver has a charge-pump circuit for charging pump a voltage level of the gate-drive signal.

9. The controller as claimed in claim 8, wherein the gate driver comprises:
   a high-side transistor for generating a high state of the gate-drive signal;
   in which the charge-pump circuit comprises:
   a charge-pump capacitor;
   a first current source coupled to charge the charge-pump capacitor when the gate-drive signal is disabled; and
   a second current source series coupled to the charge-pump capacitor and a gate of the high-side transistor for generating a gate voltage;

in which the gate voltage is coupled to the gate of the high-side transistor to drive the high-side transistor, and the gate voltage is correlated to the second current source and a voltage generated in the charge-pump capacitor.

10. The controller as claimed in claim 9, wherein the gate driver comprises:

a voltage damper coupled to the charge-pump capacitor and the gate of the high-side transistor for clamping a maximum voltage of the gate-drive signal.

11. The controller as claimed in claim 8, further comprising:

a switching circuit generating a switching signal in response to a feedback signal;

in which the gate driver generates the gate-drive signal in response to the switching signal.

* * * * *